(12) United States Patent
Zamir et al.

(10) Patent No.: US 11,502,702 B2
(45) Date of Patent: Nov. 15, 2022

(54) READ THRESHOLD CALIBRATION USING MULTIPLE DECODERS

(71) Applicant: Western Digital Technologies, Inc., San Jose, CA (US)

(72) Inventors: Ran Zamir, Ramat Gan (IL); Eran Sharon, Rishon Lezion (IL); Alexander Bazarsky, Holon (IL)

(73) Assignee: Western Digital Technologies, Inc., San Jose, CA (US)

(*) Notice: Subject to any disclaimer, the term of this patent is extended or adjusted under 35 U.S.C. 154(b) by 130 days.

(21) Appl. No.: 16/889,501

(22) Filed: Jun. 1, 2020

(65) Prior Publication Data
US 2021/0376854 A1    Dec. 2, 2021

(51) Int. Cl.
| | | |
|---|---|---|
| *H03M 13/01* | (2006.01) |
| *H03M 13/15* | (2006.01) |
| *G11C 29/42* | (2006.01) |
| *G11C 29/44* | (2006.01) |
| *H03M 13/11* | (2006.01) |
| *G11C 29/12* | (2006.01) |
| *G06F 11/07* | (2006.01) |
| *H03M 13/00* | (2006.01) |
| *G11C 29/52* | (2006.01) |
| *G06F 3/06* | (2006.01) |
| *G11C 16/26* | (2006.01) |

(52) U.S. Cl.
CPC .......... *H03M 13/015* (2013.01); *G11C 29/42* (2013.01); *G11C 29/44* (2013.01); *H03M 13/1105* (2013.01); *H03M 13/1575* (2013.01); *G06F 3/0619* (2013.01); *G06F 3/0679* (2013.01); *G06F 11/076* (2013.01); *G11C 16/26* (2013.01); *G11C 29/52* (2013.01); *G11C 2029/1202* (2013.01); *H03M 13/6561* (2013.01)

(58) Field of Classification Search
CPC .... G06F 11/076; G06F 3/0619; G06F 3/0679; H03M 13/1105; H03M 13/6561; H03M 13/015; H03M 13/1575; G11C 29/44; G11C 16/26; G11C 29/52; G11C 29/42; G11C 2029/1202
See application file for complete search history.

(56) References Cited

U.S. PATENT DOCUMENTS

| | | |
|---|---|---|
| 9,697,905 B2 | 7/2017 | Sharon et al. |
| 2016/0218740 A1* | 7/2016 | Parthasarathy .......... G06F 11/07 |
| 2017/0139761 A1* | 5/2017 | Song ...................... G06F 11/08 |

* cited by examiner

*Primary Examiner* — April Y Blair
*Assistant Examiner* — Sazzad Hossain
(74) *Attorney, Agent, or Firm* — Michael Best & Friedrich LLP

(57) ABSTRACT

A memory controller includes, in one embodiment, a memory interface, a plurality of decoders, and a controller circuit. The memory interface is configured to interface with a memory having a plurality of wordlines. Each decoder of the plurality of decoders is configured to determine a bit error rate (BER). The controller circuit configured to generate a plurality of bit-error-rate estimation scan (BES) hypotheses for one wordline of the plurality of wordlines, divide the plurality of BES hypotheses among the plurality of decoders, receive BER results from the plurality of decoders based on the plurality of BES hypotheses, and adjust one or more read locations of the one wordline based on the BER results from the plurality of decoders.

20 Claims, 5 Drawing Sheets

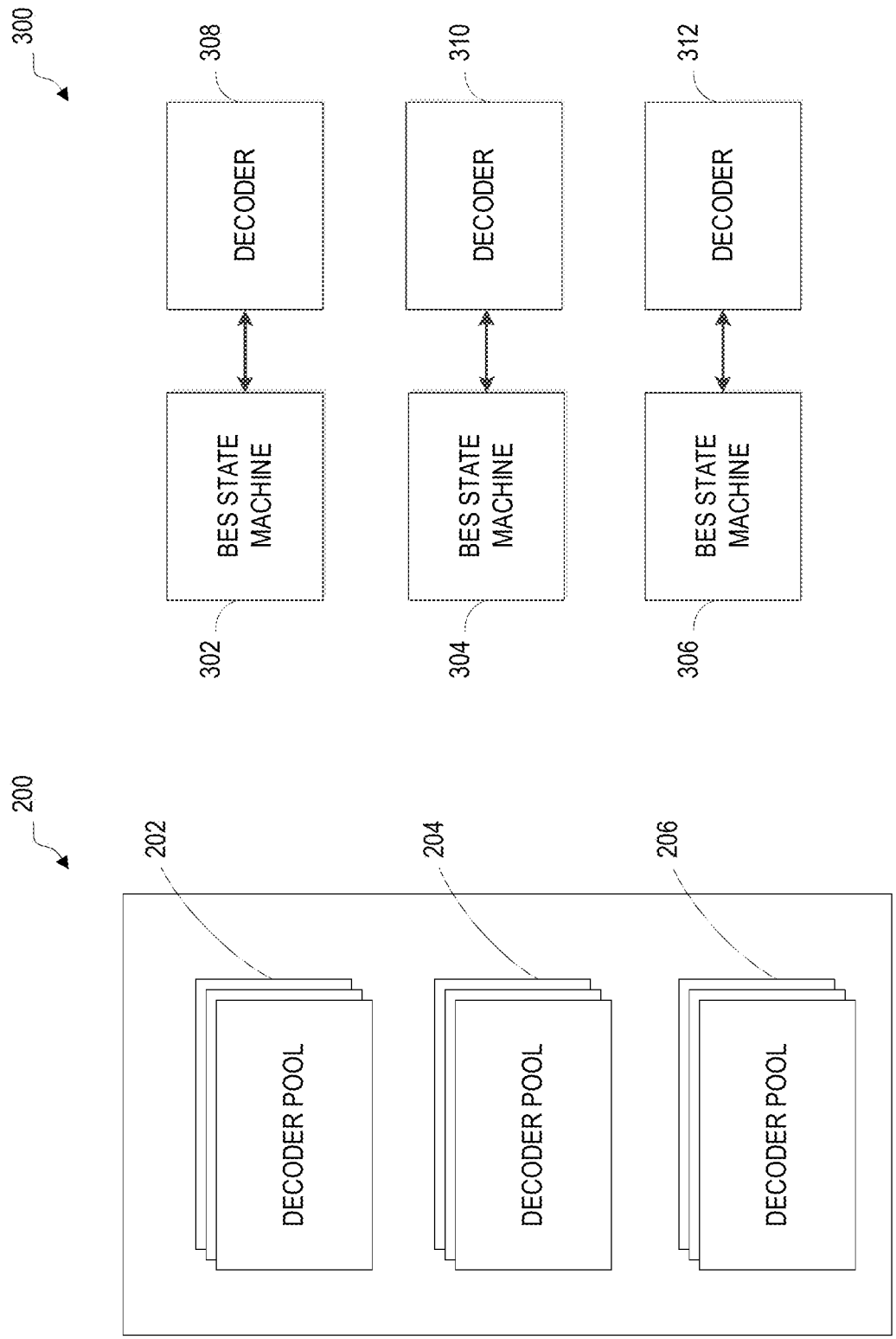

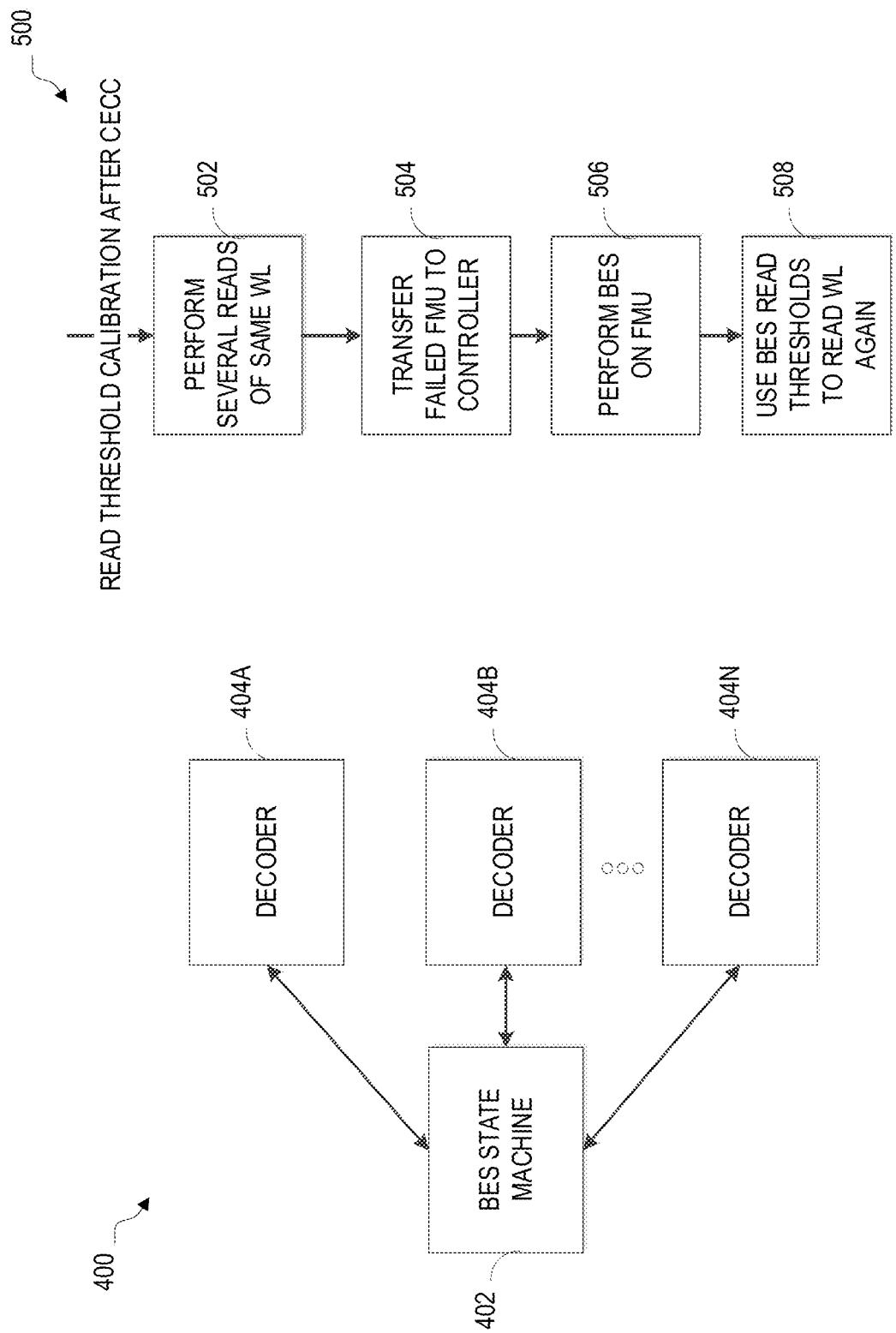

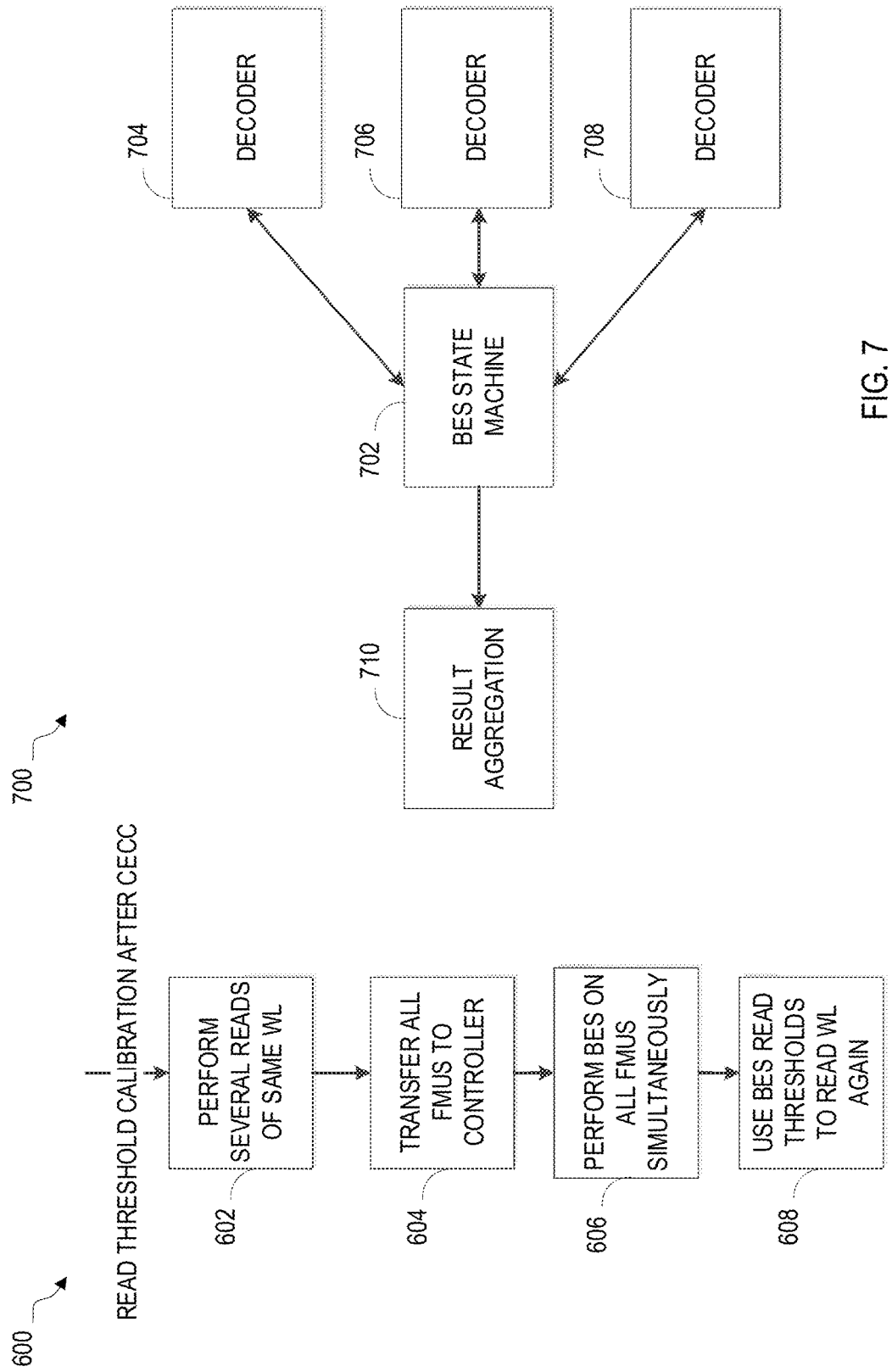

READ THRESHOLD CALIBRATION USING MULTIPLE DECODERS

FIELD

This application relates generally to a controller, such as a memory controller. More specifically, this application relates to a memory controller with a read threshold calibration using multiple decoders.

BACKGROUND

QoS (Quality of Service) requirements establish the expected characteristics of a flash controller. As QOS requirements increase over time, and as the number of stacked layers increase over time, the NAND blocks become larger containing more wordlines, and the wordline-to-wordline variation is increased.

The increase in QOS requirements over time and the increase in the wordline-to-wordline variation puts an emphasis on maintaining the proper read threshold in order to maintain performance and reliability. This emphasis is also placed on the read threshold calibration operation, which needs to be performed more frequently as a maintenance operation of the memory controller. A read threshold is one or more read locations for reading data from a wordline at a particular voltage level. A read threshold calibration is a process that determines the one or more read locations for reading data from the wordline at the particular voltage level with the lowest bit error rate (BER).

With the introduction of memories having multi-level cells, the complexity of the read threshold calibration operation has increased exponentially. Some examples of read threshold calibration operations may even take a few milliseconds, which is a burden on the read timeout and QoS requirements.

SUMMARY

The present disclosure includes devices, methods, and apparatuses with a read threshold calibration using multiple decoders, e.g., a decoder pool. The read threshold calibration using multiple decoders reduces the latency of the threshold calibration because the read threshold calibration performs more read threshold calibration operations over the same amount of time as the conventional read threshold calibration. This increase in read threshold calibration operations may improve accuracy which in turn reduces the BER of the read data, which also leads to reduced power and higher throughput of the ECC decoder, and indirectly improves QoS of future reads. This increase in read threshold calibration operations may also be used to reduce the latency of the read calibration operation and therefore allow a higher budget for other operations.

The disclosure provides a memory controller that includes, in one embodiment, a memory interface, a plurality of decoders, and a controller circuit. The memory interface is configured to interface with a memory having a plurality of wordlines. Each decoder of the plurality of decoders is configured to determine a bit error rate (BER). The controller circuit configured to generate a plurality of bit-error-rate estimation scan (BES) hypotheses for one wordline of the plurality of wordlines, divide the plurality of BES hypotheses among the plurality of decoders, receive BER results from the plurality of decoders based on the plurality of BES hypotheses, and adjust one or more read locations of the one wordline based on the BER results from the plurality of decoders.

The disclosure also provides a method. In one embodiment, the method includes generating, with a controller circuit, a plurality of bit-error-rate estimation scan (BES) hypotheses for one wordline of a plurality of wordlines. The method includes dividing, with the controller circuit, the plurality of BES hypotheses among a plurality of decoders. The method includes receiving, with the controller circuit, bit error rate (BER) results from the plurality of decoders based on the plurality of BES hypotheses. The method also includes adjusting, with the controller circuit, one or more read locations of the one wordline based on the BER results from the plurality of decoders.

The disclosure also provides an apparatus including, in one embodiment, means for generating a plurality of bit-error-rate estimation scan (BES) hypotheses for one wordline of a plurality of wordlines, means for dividing the plurality of BES hypotheses among a plurality of decoders, means for receiving bit error rate (BER) results from the plurality of decoders based on the plurality of BES hypotheses, and means for adjusting one or more read locations based on the BER results from the plurality of decoders.

In this manner, various aspects of the disclosure provide for improvements in at least the technical fields of memory devices and their design and architecture. The disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

BRIEF DESCRIPTION OF THE DRAWINGS

FIG. 2 is diagram illustrating a decoder pool architecture 200.

FIG. 3 is a block diagram illustrating a conventional example of a BES operational structure with the decoder pool of FIG. 2.

FIG. 4 is a block diagram illustrating an example of a BES operational structure with the decoder pool of FIG. 2, according to various aspects of the present disclosure.

FIG. 5 is a flow diagram illustrating a conventional example of a read threshold calibration process with the decoder pool of FIG. 2 after an ECC failure.

FIG. 6 is a flow diagram illustrating an example of a read threshold calibration process with the decoder pool of FIG. 2 after an ECC failure, according to various aspects of the present disclosure.

FIG. 7 is a block diagram illustrating an example of a second BES operational structure with the decoder pool of FIG. 2, according to various aspects of the present disclosure.

DETAILED DESCRIPTION

Figure 1:
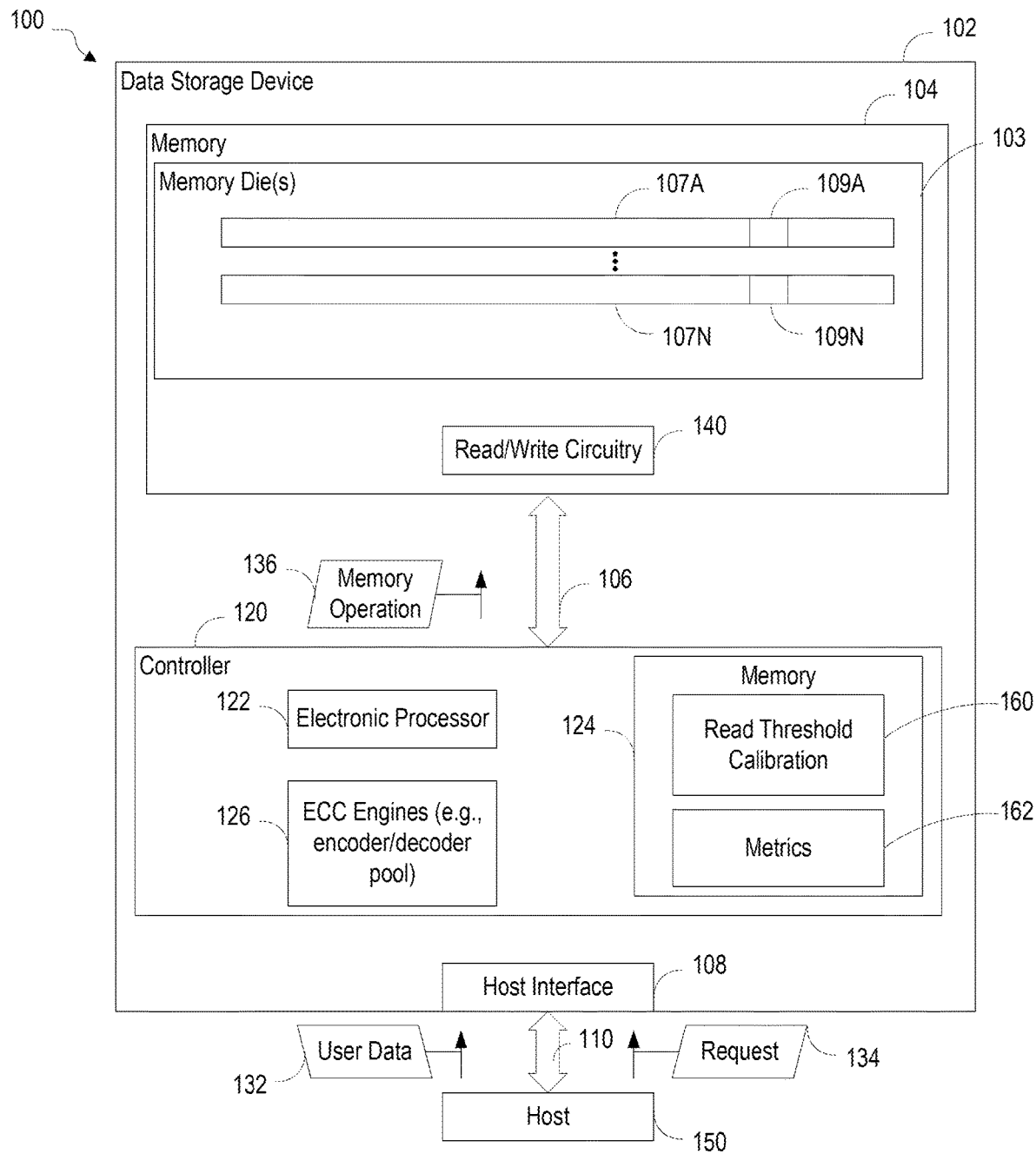
FIG. 1 is block diagram of a system including a data storage device that has a memory reading data based on a read threshold calibration using multiple decoders, in accordance with some embodiments of the disclosure.

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the data storage device may be performed by hardware (e.g., analog or digital circuits), a combination of hardware and software (e.g., a non-transitory computer-readable medium and an electronic processor), or any other suitable means. The following description is intended solely to give a general idea of various aspects of the disclosure, and does not limit the scope of the disclosure in any way.

In order to calibrate thresholds using ECC code, a memory controller checks the bit error rate (BER) for various threshold combinations. For example, in case a page has two thresholds, and there is five threshold locations, the memory controller will need to check twenty-five ($5^2=25$) possible combinations (also referred to as "hypotheses"). The memory controller, after checking all possible combinations, then selects the combination with the lowest BER. The read threshold calibration may be conducted through the process of applying a number of senses and then sequentially calculating some metric according to different hypotheses related to that number of senses. Conventionally, an ECC decoder pool which involves a number of independent ECC decoders serving the same command queue has been used to allow for higher throughput requirements and stricter QoS requirements.

A memory controller of the present disclosure may check all possible combinations by performing twenty-five physical senses of the page (e.g., a NAND page). In other examples, the memory controller of the present disclosure may check all possible combinations by digitally generating all combinations/hypotheses. This process of digitally generating all combinations may be called BER Estimation scan or "BES."

The memory controller of the present disclosure is described with respect to the BES method. However, the memory controller of the present disclosure is not limited to the BES method. The memory controller of the present disclosure may also read all combinations physically in addition to, or instead of, digitally generating all possible combinations.

As described herein, there are two tasks that may be distributed across multiple decoders working together: 1) generating the BES hypotheses from the various read pages, where each hypothesis represents the read if the memory controller were to have read from a specific threshold combination, and 2) calculating/estimating the BER. In some examples, each decoder of the multiple decoders may calculate the BER exactly by decoding the data and counting the bit flips. In other examples, each decoder of the multiple decoders may estimate the BER by calculating the syndrome-weight (SW), which is a good proxy for the BER and requires less computational resources.

A decoder of the present disclosure is generally considered to calculate the BER with the SW process because the SW process requires less computational resources. However, the decoder of the present disclosure is not limited to calculating the BER with the SW process. The decoder of the present disclosure may also calculate the BER by decoding data the data and counting the bit flips in addition to, or instead of, calculating the BER with the SW process.

FIG. 1 is block diagram of a system including a data storage device that has a memory reading data based on a read threshold calibration using multiple decoders, in accordance with some embodiments of the disclosure. In the example of FIG. 1, the system 100 includes a data storage device 102 and a host device 150. The data storage device 102 includes a controller 120 and a memory 104 (e.g., non-volatile memory) that is coupled to the controller 120.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a multi-level non-volatile memory (e.g., NOR, NAND, PCM, MRAM, 3-D XPoint, DRAM, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. Each storage element of the group of storage elements 107A-107N may be configured as a wordline. Each storage element of the group of storage elements 107A-107N may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data.

The controller 120 is configured to send a read command to the memory 104 to access data from a specified address of the memory 104. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations. For example, the controller 120 is configured to read threshold calibration 160 on the memory 104 according to the read threshold calibration process 600 as described in greater detail below with respect to FIG. 6. Additionally, the relationship between the ECC engines 126 and the read threshold calibration 160 is described in greater detail below with respect to FIGS. 4 and 7.

The controller 120 may include an electronic processor 122, a memory 124, and an error correction code (ECC) engines 126 (e.g., a decoder pool as described in FIG. 2 below). The electronic processor 122 may be a microprocessor or other suitable electronic processing device. One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The metrics 162 may be tracked on a storage element-by-storage element basis, on a wordline-by-wordline basis, on a block-by-block basis, on a die-by-die basis, or other suitable basis. The one or more metrics 162 may track a program/erase (P/E) count (PEC), a bit error rate (BER), a programming time, an erase time, a number of voltage pulses to program a storage element, a number of voltage pulses to erase a storage element, a combination thereof, or other suitable metrics corresponding to the memory 104.

FIG. 2 is diagram illustrating a decoder pool architecture 200. In the decoder pool architecture 200 (also referred to as an LDPC decoder), several decoding engines are used.

As illustrated in FIG. 2, in the decoder pool architecture 200, instead of using a single decoder engine, the decoder engines are divided into pools 202-206 of independent decoders.

Conventionally, the BES hypotheses are calculated by using a BER estimation engine that is part of a single decoder. However, the conventional approaches do not take advantage of the decoder pool architecture 200. Instead, the conventional approaches run the BES operation on single engines of the decoder pool at the same rate as the single decoder engine.

FIG. 3 is a block diagram illustrating a conventional example of a BES operational structure 300 with the decoder pool architecture 200 of FIG. 2. As illustrated in the BES operational structure 300 of FIG. 3, each BES operation output by BES state machines 302-306 is performed in a corresponding single decoder from the decoder pool architecture 200, i.e., one of the decoders 308-312. A BES state machine, for example, the BES state machine 302, contains the mechanism that produces the BES hypotheses and sends the BES hypotheses to the decoder to calculate the syndrome weight (SW), which is a proxy for the BER estimation, or to decode and calculate the BER exactly.

Each of the BES hypotheses represents a combination of read locations. For example, when there are seven read locations and two read thresholds per page, then there will be seven squared possibilities of read location combinations that will provide the least amount of errors during a read operation.

As illustrated in FIG. 3, the first decoder 308 may be calibrating the threshold of page one, the second decoder 310 may be calibrating the thresholds of page two, and the third decoder 312 may be calibrating the thresholds of page three. In other words, in the BES operational structure 300, each separate decoder will calibrate the thresholds of a separate page based on BES hypotheses from separate BES state machines. There is no consideration to simultaneous BES of several frame memory units (FMUs) from the same WL.

A frame memory unit (FMU) may be the basic read unit from the flash (e.g., 4 kilobytes in size). The FMU may also be the smallest read unit that the host 150 may read from the data storage device 102. A flash wordline includes several FMUs. For example, as described herein, a flash wordline has four FMUs for a total of sixteen kilobytes per wordline/page.

The read threshold calibration of the present disclosure uses several decoders for the benefit of a BES operation on a single FMU, thus reducing the latency. The read threshold calibration of the present disclosure may also perform the BES operation on all FMUs coming from the same WL simultaneously, thus achieving better accuracy.

FIG. 4 is a block diagram illustrating an example of a BES operational structure 400 with the decoder pool architecture 200 of FIG. 2, according to various aspects of the present disclosure. As illustrated in the BES operational structure 400 of FIG. 4, a centralized BES state machine 402 controls a plurality of decoders 404A-404N from the decoder pool architecture 200 of FIG. 2 and schedules the tasks of the plurality of decoders 404A-404N. The centralized BES state machine 402 divides the BES hypotheses between the plurality of decoders 404A-404N to keep any one decoder in the plurality of decoders 404A-404N from becoming idle. In some examples, the plurality of decoders 404A-404N may also have BER estimation modules that are faster or slower (due to the BER estimation module parallelism) so that the modules are not necessarily synchronized.

Similar to the BES operational structure 300, in the BES operational structure 400, each of the BES hypotheses represents a certain combination of read locations. For example, when there are seven read locations and two read thresholds per page, then there will be seven squared possibilities of read location combinations that will provide the least amount of errors during a read operation. In some examples, an interpolation may be performed between some of the BES hypotheses instead of selecting a single BES hypothesis.

Additionally, by dividing the BES hypotheses among the plurality of decoders 404A-404N, the determination of the best BES hypothesis (i.e., the read location combination that will provide the least amount of errors during a read operation) occurs faster and more BES hypotheses may be checked during the same amount of time, which results in better accuracy.

As read threshold calibration often happens during exceptions, the latency decrease of the BES operational structure 400 may be very significant, up to the number of decoders in the plurality of decoders 404A-404N. For example, when there are four decoding engines in a given system, the BES calculation performed in the example 400 may be four times faster than the conventional example 300.

FIG. 5 is a flow diagram illustrating a conventional example of a read threshold calibration process 500 with the decoder pool architecture 200 of FIG. 2 after an ECC failure. As illustrated in FIG. 5, the read threshold calibration process 500 includes performing several reads of the same wordline for the different threshold locations (at block 502). The read threshold calibration process 500 includes transferring the failed FMU to the controller 120 (at block 504). The read threshold calibration process 500 actually reads all four FMUs. However, the read threshold calibration process 500 only transfers the failed FMU because the read threshold calibration process 500 uses a single decoder available to perform the BES. Moreover, the read threshold calibration process 500 does not provide the failed FMU to multiple decoders because it would result in the same read locations across the multiple decoders.

The read threshold calibration process 500 includes performing BES on the failed FMU (at block 506). The read threshold calibration process 500 also includes reading the wordline at read locations based on the BES of the failed FMU (at block 508). The accuracy of the BES read thresholds is very significant because read locations with the lowest BER are necessary to reduce the number of errors in the failed FMU and improving the chance of decoding the failed FMU.

FIG. 6 is a flow diagram illustrating an example of a read threshold calibration process 600 with the decoder pool architecture 200 of FIG. 2 after an ECC failure according to various aspects of the present disclosure. As illustrated in FIG. 6, the controller 120 uses the read threshold calibration process 600 to perform several reads with different threshold locations of the same wordline (at block 602).

However, unlike the read threshold calibration process 500, the controller 120 uses the read threshold calibration process 600 to transfer all of the FMUs of a given wordline to the controller 120 (for example, four FMUs per wordline) (at block 604). The controller 120 uses the read threshold calibration process 600 to perform BES on all of the FMUs simultaneously (at block 606). The controller 120 also uses the read threshold calibration process 600 to read the wordline at read locations based on the BES convergence of all of the FMUs (at block 608).

By performing BES on all of the FMUs simultaneously, the controller 120 may aggregate bit error rate (BER) results of the individual BES operations, and the aggregate will be more accurate than using a bit error rate (BER) result of only a single BES operation. The aggregate BER result is more accurate because all of the FMUs came from the same wordline and experience the same condition, i.e., experience the same stress and other factors that change a condition of a wordline. The read locations that are based on the BES of all of the FMUs are also more accurate than read locations based on a single FMU because there is more data available when all of the FMUs are transferred to the controller 120.

Although the read threshold calibration process 600 requires transferring more FMUs than the read threshold calibration process 500, the overall latency associated with the read threshold calibration process 600 may be less than the overall latency associated with the read threshold calibration process 500 because the BES operation converges faster in the read threshold calibration process 600 with the additional data from the additional FMUs.

FIG. 7 is a block diagram illustrating an example of a second BES operational structure 700 with the decoder pool architecture 200 of FIG. 2, according to various aspects of the present disclosure. As illustrated in the BES operational structure 700 of FIG. 7, a centralized BES state machine 702 controls a plurality of decoders 704A-704N from the decoder pool architecture 200 of FIG. 2 and schedules the simultaneous BES tasks of the plurality of decoders 704A-704N. The centralized BES state machine 702 divides the work between the plurality of decoders 704A-704N to keep any one decoder in the plurality of decoders 704A-704N from becoming idle and achieve the fastest convergence on the BES threshold.

As illustrated in FIG. 7, the BER results of the individual operations of the plurality of decoders 704A-704N may either be averaged or otherwise aggregated by the BES state machine 702 as a result aggregation 710. The BES threshold may be based on the result aggregation 710 and the BES threshold will be more accurate than a BES threshold based on a single result from a single decoder.

Figure 8:
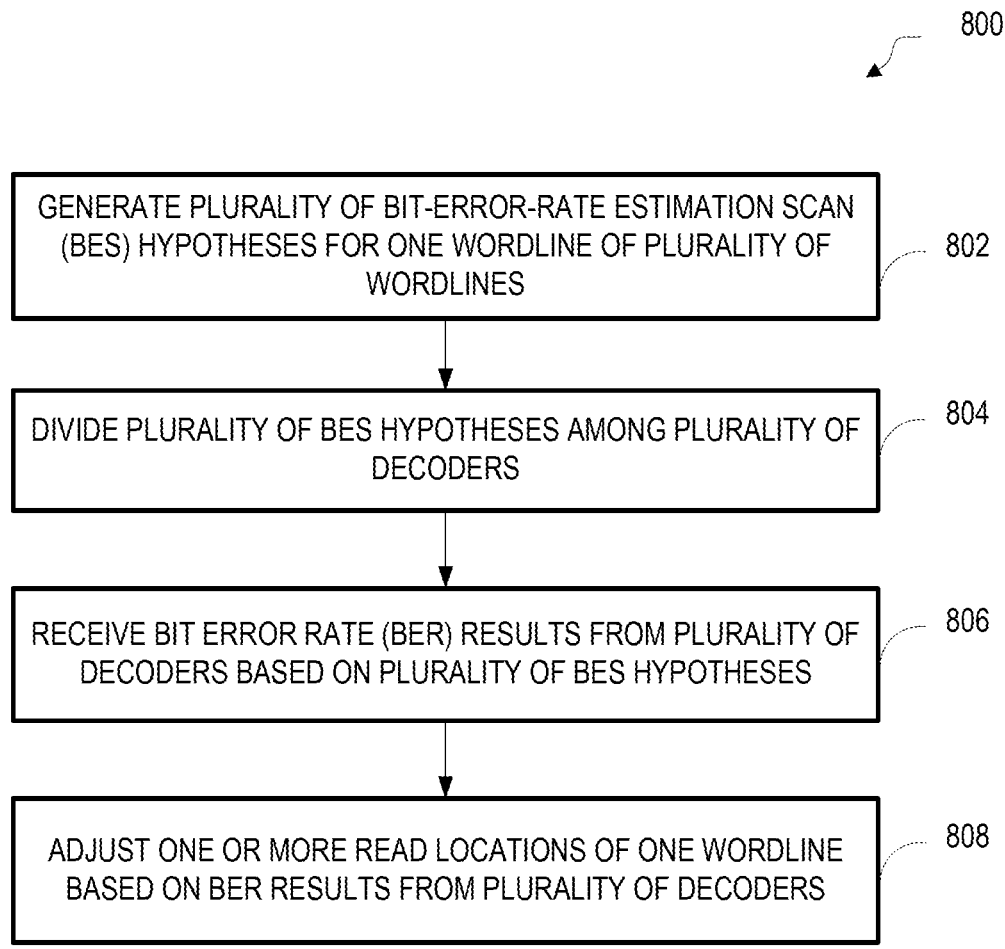
FIG. 8 is a flowchart illustrating a read threshold calibration process, in accordance with some embodiments of the disclosure.

FIG. 8 is a flowchart illustrating a read threshold calibration process 800, in accordance with some embodiments of the disclosure. FIG. 8 is described with reference to FIG. 1.

The read threshold calibration process 800 includes generating, with the controller circuit, a plurality of bit-error-rate estimation scan (BES) hypotheses for one wordline of a plurality of wordlines (at block 802). For example, the electronic processor 122 generates a plurality of BES hypotheses for the storage element 107A.

The read threshold calibration process 800 includes dividing, with the controller circuit, the plurality of BES hypotheses among a plurality of decoders (at block 804). For example, the electronic processor 122 divides the plurality of BES hypotheses among the ECC engines 126.

The read threshold calibration process 800 includes receiving, with the controller circuit, bit error rate (BER) results from the plurality of decoders based on the plurality of BES hypotheses (at block 806). For example, the electronic processor 122 receives BER results from the ECC engines 126 based on the plurality of BES hypotheses. The BER results may include read location combinations that provide the least amount of errors during a read operation or the BER/SW for some of the hypotheses.

The read threshold calibration process 800 also includes adjusting, with the controller circuit, one or more read locations of the one wordline based on the BER results from the plurality of decoders (at block 808). For example, the electronic processor 122 adjusts one or more read locations for the storage element 107A based on the BER results from the ECC engines 126.

The read threshold calibration process 800 may be performed in at least two different use cases. The first use case is a periodic maintenance operation, where the electronic processor 122 initiates a periodical operation to calibrate the threshold of a certain block and/or wordline. In some examples, the periodic maintenance operation may be performed without a regular read of the wordline. In other examples, the periodic maintenance operation may be performed with a regular read of the wordline.

The second use case is an ECC failure, where the electronic processor 122 performs a regular read operation and fails decode a certain FMU. In response to failing to decode the certain FMU, the electronic processor 122 initiates a recovery flow which includes the read threshold calibration 800. In other words, the electronic processor 122 may first perform a read operation on the one storage element 107A of a plurality of storage elements 107N with the one or more read locations and fail to decode the one storage element 107A. In response to failing to decode the one storage element 107A, the electronic processor performs the read threshold calibration process 800.

In some examples, the read threshold calibration process 800 may further include performing, with the controller circuit, a second read operation on the one wordline at the one or more read locations that are adjusted. Additionally, in some examples, the read threshold calibration process 800 may further include generating, with the controller circuit, an aggregated result by aggregating the BER results from the plurality of decoders. In these examples, adjusting the one or more read locations based on the BER results from the plurality of decoders further includes adjusting the one or more read locations based on the aggregated result.

In some examples, dividing the plurality of BES hypotheses among the plurality of decoders may further include dividing the plurality of BES hypotheses to keep the plurality of decoders in respective active states over a common timeframe. In other examples, dividing the plurality of BES hypotheses among the plurality of decoders may further include dividing the plurality of BES hypotheses to control the plurality of decoders to output respective BER results at a similar point in time.

In some examples, the one wordline includes a plurality of frame memory units (FMUs). In these examples, generating the plurality of BES hypotheses for the one wordline of the plurality of wordlines may further include generating the plurality of BES hypotheses for each FMU of the plurality of frame memory units (FMUs). Additionally, in these examples, the plurality of FMUs may be four FMUs, and each FMU may have a size of four kilobytes.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller, comprising:
a memory interface configured to interface with a memory having a plurality of wordlines;

a plurality of decoders, each decoder of the plurality of decoders is configured to determine a bit error rate (BER), such that the plurality of decoders determine a plurality of BERs; and a controller circuit configured to:
generate a plurality of bit-error-rate estimation scan (BES) hypotheses for one wordline of the plurality of wordlines,
divide the plurality of BES hypotheses among the plurality of decoders,
receive the plurality of BERs from the plurality of decoders based on the plurality of BES hypotheses, and
adjust one or more read locations of the one wordline based on the plurality of BERs from the plurality of decoders.

2. The memory controller of claim 1, wherein the controller circuit is further configured to
perform a read operation on the one wordline of the plurality of wordlines at a second one or more read locations, and
detect an ECC failure while performing the read operation on the one wordline of the plurality of wordlines at the second one or more read locations, and
generate the plurality of BES hypotheses for the one wordline of the plurality of wordlines in response to detecting the ECC failure,
wherein the second one or more read locations are different than the one or more read locations.

3. The memory controller of claim 1, wherein the controller circuit is further configured to perform a read operation on the one wordline at the one or more read locations that are adjusted.

4. The memory controller of claim 1, wherein, to divide the plurality of BES hypotheses among the plurality of decoders, the controller circuit is further configured to divide the plurality of BES hypotheses to keep the plurality of decoders in respective active states over a common timeframe.

5. The memory controller of claim 4, wherein, to divide the plurality of BES hypotheses among the plurality of decoders, the controller circuit is further configured to divide the plurality of BES hypotheses to control the plurality of decoders to output respective BER results at a similar point in time.

6. The memory controller of claim 1, wherein the one wordline includes a plurality of frame memory units (FMUs), and wherein, to generate the plurality of BES hypotheses for the one wordline of the plurality of wordlines, the controller circuit is further configured to generate the plurality of BES hypotheses for each FMU of the plurality of frame memory units (FMUs).

7. The memory controller of claim 1, wherein, to determine the BER, the each decoder of the plurality of decoders is configured to determine the BER by performing at least one of:
calculating the BER exactly by decoding data that is read from the one wordline and counting bit flips, or
calculating a syndrome weight (SW) of the one wordline that approximates the BER,
wherein the plurality of BERs include at least one of an exact BER or the SW.

8. The memory controller of claim 1, wherein the controller circuit is further configured to generate an aggregated result by aggregating the plurality of BERs from the plurality of decoders, and wherein, to adjust the one or more read locations based on the plurality of BERs from the plurality of decoders, the controller circuit is further configured adjust the one or more read locations based on the aggregated result.

9. A method, comprising:
generating, with a controller circuit, a plurality of bit-error-rate estimation scan (BES) hypotheses for one wordline of a plurality of wordlines;
dividing, with the controller circuit, the plurality of BES hypotheses among a plurality of decoders;
receiving, with the controller circuit, a plurality of bit error rates (BERs) from the plurality of decoders based on the plurality of BES hypotheses; and
adjusting, with the controller circuit, one or more read locations of the one wordline based on the plurality of BERs from the plurality of decoders.

10. The method of claim 9, further comprising:
performing, with the controller circuit, a read operation on the one wordline of the plurality of wordlines with at a second one or more read locations;
detecting, with the controller circuit, an ECC failure while performing the read operation on the one wordline of the plurality of wordlines at the second one or more read locations; and
generating, with the controller circuit, the plurality of bit-error-rate estimation scan (BES) hypotheses for the one wordline of the plurality of wordlines in response to detecting the ECC failure,
wherein the second one or more read locations are different than the one or more read locations.

11. The method of claim 9, further comprising:
performing, with the controller circuit, a second read operation on the one wordline at the one or more read locations that are adjusted.

12. The method of claim 9, wherein dividing the plurality of BES hypotheses among the plurality of decoders further includes dividing the plurality of BES hypotheses to keep the plurality of decoders in respective active states over a common timeframe.

13. The method of claim 12, wherein dividing the plurality of BES hypotheses among the plurality of decoders further includes dividing the plurality of BES hypotheses to control the plurality of decoders to output respective ones of the plurality of BERs at a similar point in time.

14. The method of claim 9, wherein the one wordline includes a plurality of frame memory units (FMUs), and wherein generating the plurality of BES hypotheses for the one wordline of the plurality of wordlines further includes generating the plurality of BES hypotheses for each FMU of the plurality of frame memory units (FMUs).

15. The method of claim 9, further comprising:
determining, with each decoder of the plurality of decoders, a bit error rate (BER) by performing at least one of:
calculating the BER exactly by decoding data that is read from the one wordline and counting bit flips, or
calculating a syndrome weight (SW) of the one wordline that approximates the BER,
wherein the plurality of BERs include at least one of an exact BER or the SW.

16. The method of claim 9, further comprising:
generating, with the controller circuit, an aggregated result by aggregating the plurality of BERs from the plurality of decoders, and
wherein adjusting the one or more read locations based on the plurality of BERs from the plurality of decoders further includes adjusting the one or more read locations based on the aggregated result.

17. An apparatus, comprising:
  means for generating a plurality of bit-error-rate estimation scan (BES) hypotheses for one wordline of a plurality of wordlines;
  means for dividing the plurality of BES hypotheses among a plurality of decoders;
  means for receiving a plurality of bit error rates (BERs) from the plurality of decoders based on the plurality of BES hypotheses; and
  means for adjusting one or more read locations based on the plurality of BERs from the plurality of decoders.

18. The apparatus of claim 17, further comprising:
  means for performing a read operation on the one wordline of the plurality of wordlines with the one or more read locations; and
  means for detecting an ECC failure while performing the read operation on the one wordline of the plurality of wordlines with the one or more read locations,
  wherein generating the plurality of bit-error-rate estimation scan (BES) hypotheses for the one wordline of the plurality of wordlines is in response to detecting the ECC failure.

19. The apparatus of claim 17, further comprising:
  means for performing a second read operation on the one wordline at the one or more read locations that are adjusted.

20. The apparatus of claim 17, wherein the one wordline includes a plurality of frame memory units (FMUs), and wherein the means for generating the plurality of BES hypotheses for the one wordline of the plurality of wordlines further includes means for generating the plurality of BES hypotheses for each FMU of the plurality of frame memory units (FMUs).

* * * * *